US010553505B2

(12) United States Patent
Niimura et al.

(10) Patent No.: US 10,553,505 B2
(45) Date of Patent: Feb. 4, 2020

(54) ASSESSMENT METHOD, AND SEMICONDUCTOR DEVICE MANUFACTURING METHOD

(71) Applicant: FUJI ELECTRIC CO., LTD., Kanagawa (JP)

(72) Inventors: Yasushi Niimura, Matsumoto (JP); Hideki Shishido, Matsumoto (JP); Takayuki Shimatou, Matsumoto (JP); Toshihiro Arai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/537,529

(22) Filed: Aug. 10, 2019

(65) Prior Publication Data

US 2019/0363027 A1 Nov. 28, 2019

Related U.S. Application Data

(62) Division of application No. 15/390,732, filed on Dec. 27, 2016, now Pat. No. 10,381,274.

(30) Foreign Application Priority Data

Feb. 9, 2016 (JP) ................................ 2016-022696
Apr. 18, 2016 (JP) ................................ 2016-082863

(51) Int. Cl.
*H01L 21/66* (2006.01)
*H01L 29/06* (2006.01)
(Continued)

(52) U.S. Cl.
CPC .......... *H01L 22/20* (2013.01); *G01R 31/2601* (2013.01); *H01L 25/50* (2013.01);
(Continued)

(58) Field of Classification Search
CPC ............. H01L 29/0634; H01L 29/0696; H01L 29/7802; H01L 29/7811; H01L 29/7813;
(Continued)

(56) References Cited

U.S. PATENT DOCUMENTS 7,372,111 B2 * 5/2008 Onishi ................ H01L 29/0634
257/401
9,013,006 B2 4/2015 Nakazawa
(Continued)

FOREIGN PATENT DOCUMENTS

JP H0434736 U 3/1992
JP 2007158198 A 6/2007
(Continued)

OTHER PUBLICATIONS

Office Action issued for counterpart Japanese Application No. 2016-082863, issued by the Japanese Patent Office dated Nov. 12, 2019 (drafted on Nov. 6, 2019).

*Primary Examiner* — Michael M Trinh

(57) ABSTRACT

To easily assess a feedback capacitance of a semiconductor element. An assessment method of assessing a feedback capacitance of a semiconductor element is provided, the assessment method including:
acquiring a first characteristic correlated with the feedback capacitance and a second characteristic correlated with the feedback capacitance; and
assessing the feedback capacitance based on the first characteristic and the second characteristic. The first characteristic may be a characteristic that corresponds to a withstanding voltage of the semiconductor element, and the second characteristic may be an on-resistance of the semiconductor element. In the assess-
(Continued)

ing, the feedback capacitance may be assessed based on a ratio between the first characteristic and the second characteristic.

15 Claims, 16 Drawing Sheets

(51) Int. Cl.
    *H01L 29/78*     (2006.01)
    *H01L 25/00*     (2006.01)
    *G01R 31/26*     (2014.01)

(52) U.S. Cl.
    CPC ...... *H01L 29/0634* (2013.01); *H01L 29/7802* (2013.01); *G01R 31/2621* (2013.01); *H01L 22/14* (2013.01)

(58) Field of Classification Search
    CPC ........... H01L 29/7835; H01L 29/66712; H01L 29/66734; H01L 29/1095; H01L 22/20; H01L 22/14; H01L 25/50; G01R 31/2601
    See application file for complete search history.

(56) References Cited

U.S. PATENT DOCUMENTS

| | | | |
|---|---|---|---|
| 2006/0157779 A1* | 7/2006 | Kachi | H01L 29/66727 257/330 |
| 2007/0045727 A1 | 3/2007 | Shiraishi | |
| 2008/0113457 A1 | 5/2008 | Tsay | |
| 2008/0211014 A1* | 9/2008 | Zeng | H01L 29/402 257/330 |
| 2009/0159927 A1* | 6/2009 | Willmeroth | H01L 29/0634 257/139 |
| 2010/0327348 A1 | 12/2010 | Hashimoto | |
| 2013/0037853 A1* | 2/2013 | Onozawa | H01L 29/0661 257/139 |
| 2016/0020101 A1* | 1/2016 | Nishimura | H01L 21/2253 438/138 |
| 2016/0148923 A1* | 5/2016 | Nakazawa | H01L 27/0255 257/328 |
| 2016/0181413 A1* | 6/2016 | Fujita | H01L 29/7802 |
| 2016/0254379 A1 | 9/2016 | Yamashita | |

FOREIGN PATENT DOCUMENTS

| | | |
|---|---|---|
| JP | 2011009352 A | 1/2011 |
| JP | 2016-004935 A | 1/2016 |

* cited by examiner

ASSESSMENT METHOD, AND SEMICONDUCTOR DEVICE MANUFACTURING METHOD

CROSS-REFERENCE TO RELATED APPLICATIONS

This application is a divisional of U.S. patent application Ser. No. 15/390,732, filed on Dec. 27, 2016, now U.S. Pat. No. 10,381,274, which claims priority to Japanese Patent Application No. 2016-022696, filed on Feb. 9, 2016, and Japanese Patent Application No. 2016-082863 filed on Apr. 18, 2016, the contents of each of which are hereby incorporated herein by reference in their entirety.

BACKGROUND

1. Technical Field

The present invention relates to an assessment method and a semiconductor device manufacturing method.

2. Related Art

As one of characteristics of semiconductor elements, a feedback capacitance Crss is known (please see Patent Document 1, for example).
Patent Document 1: Japanese Patent Application Publication No. 2016-4935

A feedback capacitance Crss of a semiconductor element is preferably measured beforehand. For example, variations in feedback capacitances Crss of a plurality of semiconductor elements to be used for upper and lower arms or the like of a bridge circuit may result in variations in switching timing, and this may cause drawbacks such as short-circuiting of upper and lower arms. However, it takes time to directly measure feedback capacitances Crss of semiconductor elements.

SUMMARY

A first aspect of the present invention provides an assessment method of assessing a feedback capacitance of a semiconductor element. The assessment method may include acquiring. The acquiring may include acquiring a first characteristic correlated with the feedback capacitance. The acquiring may include acquiring a second characteristic correlated with the feedback capacitance. The assessment method includes assessing. The assessing may include assessing the feedback capacitance based on the first characteristic and the second characteristic. The first characteristic may have a positive correlation with the feedback capacitance, and the second characteristic may have a negative correlation with the feedback capacitance.

The first characteristic may be a characteristic that corresponds to a withstanding voltage of the semiconductor element. The second characteristic may be an on-resistance of the semiconductor element. The first characteristic may be an avalanche voltage in a steady state. The first characteristic may be an avalanche voltage in a transitional state. The first characteristic may be calculated from a plurality of the avalanche voltages measured in a semiconductor element that is brought into different states. The first characteristic may be calculated from a first avalanche voltage in a transitional state and a second avalanche voltage in a transitional state that are measured by applying different drain currents. The first characteristic may be calculated from an avalanche voltage in a steady state and an avalanche voltage in a transitional state. The first characteristic may be calculated from: a first avalanche voltage in a transitional state; a second avalanche voltage in a transitional state measured by applying a drain current that is different from that for the first avalanche voltage; and a third avalanche voltage in a steady state measured by applying a drain current which is the same as that for either the first avalanche voltage or the second avalanche voltage. The first characteristic may be calculated from an avalanche voltage of the semiconductor element, and the second characteristic may be calculated from an avalanche voltage measured in the semiconductor element in a state different from that for the first characteristic. In the assessing, the feedback capacitance may be assessed based on a ratio between the first characteristic and the second characteristic.

In the acquiring, the first characteristics and the second characteristics may be acquired for a plurality of semiconductor elements. The assessing may include generating distribution information indicative of a distribution of a ratio between the first characteristic and the second characteristic of each semiconductor element among the plurality of semiconductor elements.

The assessment method may further include screening. The screening may include detecting a normal distribution included in the distribution information, and screening an abnormal semiconductor element based on the detected normal distribution. The screening may include screening the abnormal semiconductor element based on a standard deviation of the normal distribution.

The distribution information may be a histogram. The screening may include detecting, as the normal distribution, a ridge including a peak of a higher frequency if the histogram includes a plurality of ridges. The acquiring may include acquiring the first characteristic and the second characteristic of each semiconductor element among a plurality of the semiconductor elements that are formed on a wafer. The semiconductor element may have a super junction structure.

A second aspect of the present invention provides a semiconductor device manufacturing method. The manufacturing method may include acquiring. The acquiring may include, for each semiconductor element among a plurality of semiconductor elements, acquiring a first characteristic that has a positive correlation with a feedback capacitance of the semiconductor element. The acquiring may include, for each semiconductor element among a plurality of semiconductor elements, acquiring a second characteristic that has a negative correlation with a feedback capacitance of the semiconductor element. The manufacturing method may include assessing. The assessing may include assessing the feedback capacitance based on the first characteristic and the second characteristic. The manufacturing method may include screening. The screening may include screening a plurality of semiconductor elements based on an assessment result obtained at the assessing. The manufacturing method may include assembling. The assembling may include assembling a semiconductor device by using a plurality of semiconductor elements that are screened at the screening.

The summary clause does not necessarily describe all necessary features of the embodiments of the present invention. The present invention may also be a sub-combination of the features described above.

BEST MODE FOR CARRYING OUT THE INVENTION

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
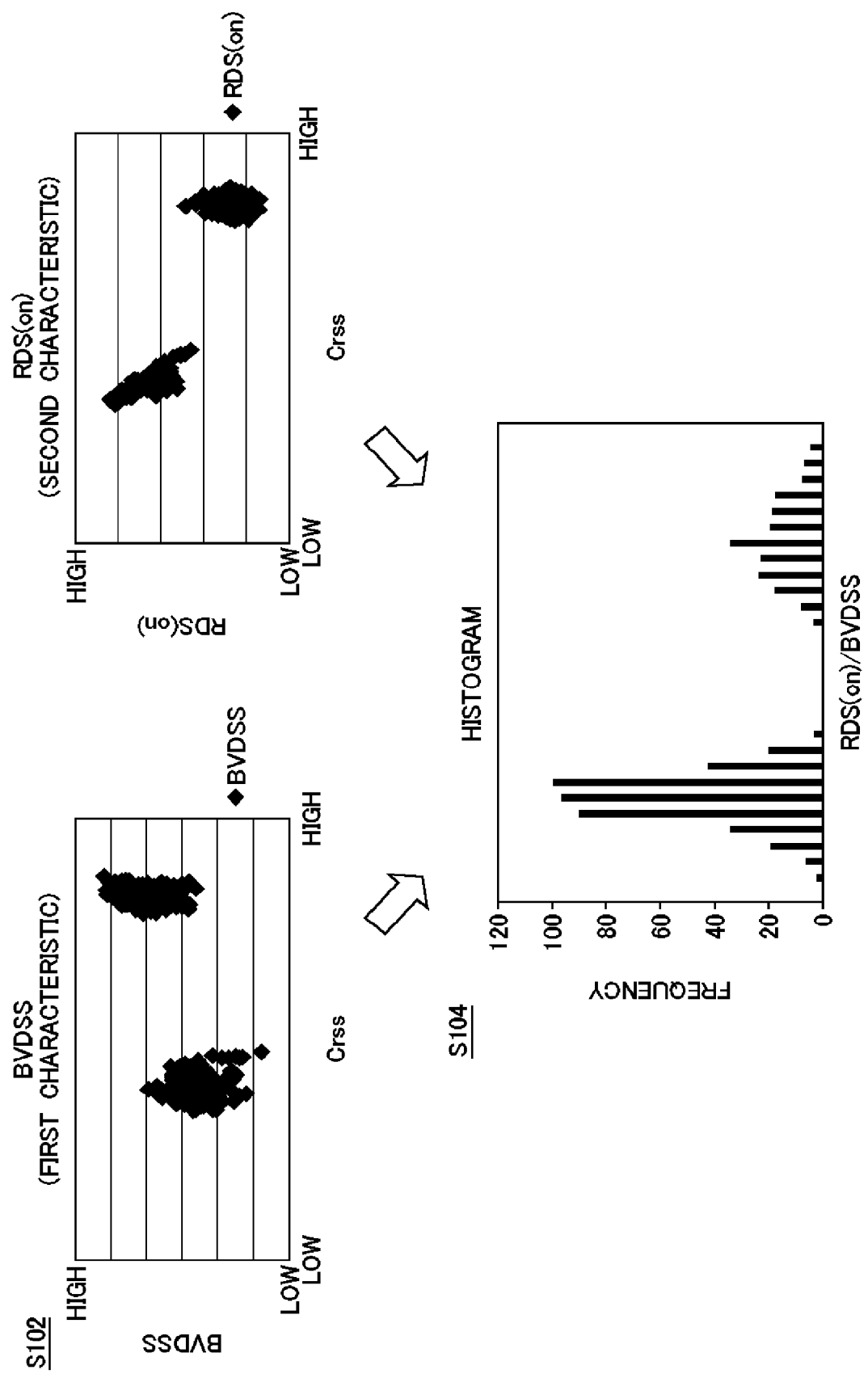
FIG. 1 is a figure for explaining an exemplary assessment method of assessing a feedback capacitance Crss of a semiconductor element according to one embodiment of the present invention.

FIG. 1 is a figure for explaining an exemplary assessment method of assessing a feedback capacitance Crss of a semiconductor element according to one embodiment of the present invention. As one example, the semiconductor element is a MOSFET having a super junction (SJ) structure. The feedback capacitance Crss in the present example is a parasitic capacitance between a gate and a drain in the SJ-MOSFET.

At a characteristic acquiring step S102, a first characteristic correlated with the feedback capacitance Crss and a second characteristic correlated with the feedback capacitance Crss are acquired. As one example, the first characteristic has a positive correlation with the feedback capacitance Crss, and the second characteristic has a negative correlation with the feedback capacitance Crss. A positive correlation refers to a correlation in which as the feedback capacitance Crss increases, a corresponding characteristic value tends to increase, and a negative correlation refers to a correlation in which as the feedback capacitance Crss decreases, a corresponding characteristic value tends to decrease.

In the present example, the first characteristic is a characteristic that corresponds to a withstanding voltage of the semiconductor element. As one example, the first characteristic is an avalanche voltage BVDSS at which an avalanche breakdown occurs to the semiconductor element. The avalanche voltage BVDSS is a drain-source voltage measured by applying a predetermined drain current to the semiconductor element in a state where the gate and source of the semiconductor element are short-circuited. The avalanche voltage BVDSS may be a voltage measured after the drain-source voltage has entered a steady state or a voltage measured in a transitional state during which the drain-source voltage is changing transitionally. Also, in the present example, the second characteristic is an on-resistance of the semiconductor element. More specifically, the on-resistance is a source-drain resistance RDS(on) in an ON state of the MOSFET.

FIG. 1 shows a result obtained by plotting a relationship between the feedback capacitance Crss and the avalanche voltage BVDSS, and a relationship between the feedback capacitance Crss and the on-resistance RDS(on) that are obtained by measurement on a plurality of semiconductor elements. In the example shown in FIG. 1, an avalanche voltage BVDSS measured in a steady state is used. Unless particularly explained otherwise in the present specification, the avalanche voltage BVDSS refers to an avalanche voltage BVDSS measured in a steady state. In FIG. 1, a distribution acquired by directly measuring the feedback capacitance Crss, the avalanche voltage BVDSS and the on-resistance RDS(on) of the semiconductor elements respectively is shown.

In the example shown in FIG. 1, a measurement result obtained by performing measurement on semiconductor elements formed on a plurality of wafers is shown. A plurality of semiconductor elements are formed on a single piece of wafer. Variations in manufacturing conditions between wafers result in variations in the feedback capacitances Crss, the avalanche voltage BVDSS and the on-resistance RDS(on) wafer-by-wafer. FIG. 1 shows a measurement result of semiconductor elements belonging to a first wafer group which are manufactured under normal manufacturing conditions, and semiconductor elements belonging to a second wafer group manufactured under manufacturing conditions having a predetermined error. Specifically, a distribution having lower feedback capacitances Crss corresponds to the second wafer group, and a distribution having larger feedback capacitances Crss corresponds to a first wafer group.

As shown in FIG. 1, there is a positive correlation between the feedback capacitances Crss and the avalanche voltages BVDSS. Also, there is a negative correlation between the feedback capacitances Crss and the on-resistances RDS(on).

Next, at an assessment step S104, the feedback capacitance Crss is assessed based on the first characteristic and the second characteristic. The feedback capacitance Crss can be assessed accurately by using two characteristics correlated with the feedback capacitance Crss. This is because, although there may be cases where either characteristic, the first characteristic or the second characteristic, does not allow classification based on characteristics, it becomes possible for differences in characteristics to manifest themselves by computing the two characteristics.

As one example, at the assessment step S104, the feedback capacitance Crss is assessed based on a ratio between the first characteristic and the second characteristic. In the present example, a histogram showing a distribution of a ratio between the avalanche voltage BVDSS and the on-resistance RDS(on) of each semiconductor element is generated. The histogram is exemplary distribution information. At the assessment step S104, a product of the first characteristic and the second characteristic may be used, a sum of the first characteristic and the second characteristic may be used, or a difference between the first characteristic and the second characteristic may be used.

FIG. 1 shows a histogram whose horizontal axis indicates RDS(on)/BVDSS. In the histogram, the ridge having lower RDS(on)/BVDSS corresponds to the first wafer group, and the ridge having larger RDS(on)/BVDSS corresponds to the second wafer group.

Variations in the feedback capacitances Crss can be assessed based on the histogram. Also, in the histogram, semiconductor elements that are out of a predetermined ridge can be screened. Screening of the semiconductor elements may be performed wafer-by-wafer, lot-by-lot (each lot including a plurality of wafers), region-by-region (each region included in a wafer), or semiconductor element-by-semiconductor element.

Also, semiconductor elements corresponding to respective ridges in the histogram can be grouped. By using semiconductor elements in a single group for a single circuit, a circuit configured with semiconductor elements having smaller variations in the feedback capacitances Crss can be provided.

Also, information in which a value of RDS(on)/BVDSS and a value of the feedback capacitance Crss are associated with each other may be acquired beforehand, and a value of the feedback capacitance Crss may be inferred for each semiconductor element based on a measurement result of RDS(on)/BVDSS.

The first characteristic and the second characteristic are preferably measured for each semiconductor element that are formed on a wafer. Thereby, a semiconductor device can be assembled by excluding abnormal products beforehand. For this reason, defect detection after assembly of semiconductor devices can be reduced, and manufacturing cost can be reduced. However, the first characteristic and the second characteristic may be measured after a semiconductor element is sealed with resin or the like, and formed into a semiconductor chip.

Also, at the characteristic acquiring step S102, the state of a semiconductor element may be controlled such that variations in the first characteristic and the second characteristic relative to variations in the feedback capacitances Crss are caused to manifest themselves more noticeably. For example, the first characteristic and the second characteristic may be measured in a state where a predetermined voltage or current is applied to a semiconductor element. Specifically, the first characteristic and the second characteristic may be acquired in a state where a condition which is equal to an absolute maximum rating or lower is applied to a semiconductor element. The condition which is equal to an absolute maximum rating or lower includes, other than current and voltage, a tolerance, a temperature and the like.

Figure 2:
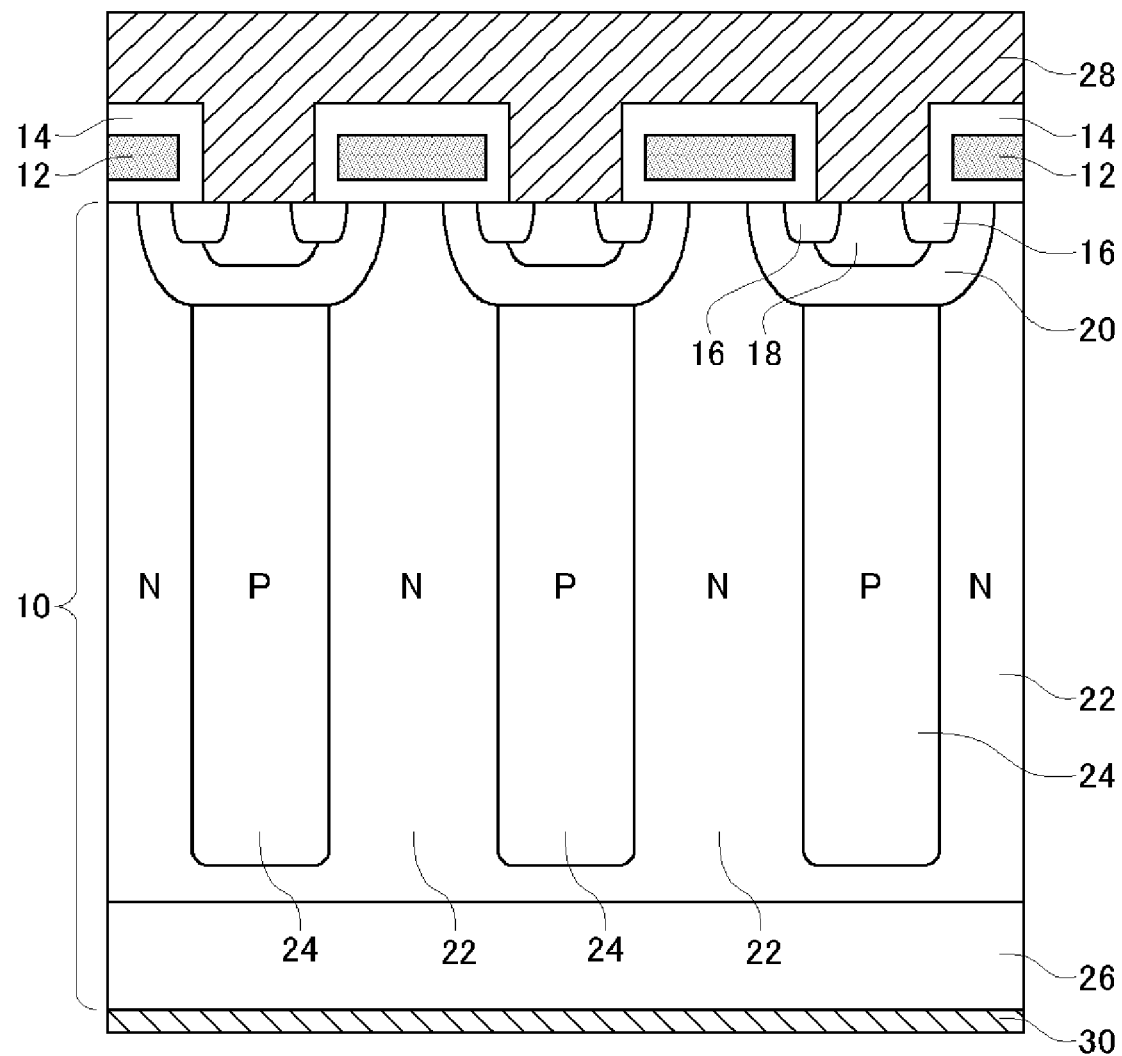
FIG. 2 is a cross-sectional view showing a semiconductor element 200 which is an exemplary assessment target.

FIG. 2 is a cross-sectional view showing a semiconductor element 200 which is an exemplary assessment target. The semiconductor element 200 in the present example is an SJ-MOSFET. The semiconductor element 200 includes a semiconductor substrate 10, gate electrodes 12, gate insulating films 14, a source electrode 28 and a drain electrode 30.

The semiconductor substrate 10 is a semiconductor substrate made of silicon or the like. The drain electrode 30 formed from a conductive material such as metal is provided on a rear surface of the semiconductor substrate 10. An N+-type drain region 26 having a higher concentration than P-type columns 24 is formed in a region adjacent to the drain electrode 30.

Inside the semiconductor substrate 10, the P-type columns 24 and N-type columns 22 are formed alternately in a direction parallel with a front surface of the semiconductor substrate 10.

The N-type columns 22 have regions that are exposed to the front surface of the semiconductor substrate 10.

The P-type columns 24 are formed below P-type base regions 20. An N+-type source region 16 and a P+-type contact region 18 are formed in a partial region of the base region 20. The source region 16 and the contact region 18 have regions that are exposed to the front surface of the semiconductor substrate 10. The source region 16 and the contact region 18 are connected with the source electrode 28.

Also, on the front surface of the semiconductor substrate 10, the gate electrodes 12 are arranged above the base regions 20 sandwiched by the source regions 16 and the N-type columns 22. The gate electrodes 12 may extend to regions above at least a portion of the source regions 16 and the N-type columns 22. The gate insulating films 14 are provided between the gate electrodes 12, and the semiconductor substrate 10 and the source electrode 28.

If the semiconductor element 200 is in an OFF-state, depletion layers spread from PN junctions between the N-type columns 22 and the P-type columns 24, and the N-type columns 22 are depleted. Thereby, the semiconductor element 200 gets to have a high withstanding voltage. Also, if the semiconductor element 200 enters an ON state, channels are formed in the base regions 20 between the source regions 16 and the N-type columns 22, and depletion layers in the N-type columns 22 contract so that current flows between the source and the drain.

Figure 3:
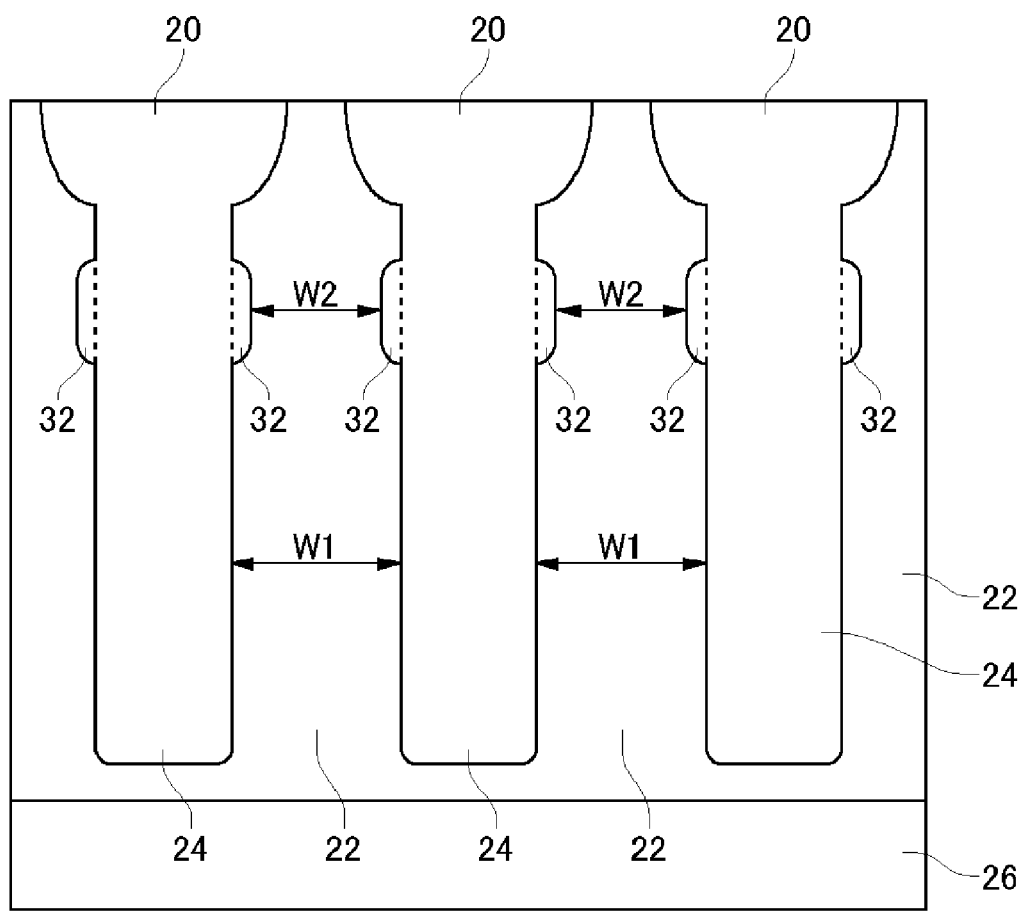
FIG. 3 is a schematic view showing N-type columns 22 and P-type columns 24 in the semiconductor element 200.

FIG. 3 is a schematic view showing the N-type columns 22 and the P-type columns 24 in the semiconductor element 200. Although the N-type columns 22 and the P-type columns 24 are formed to have generally constant widths, the widths of the N-type columns 22 and the P-type columns 24 may become nonuniform in some cases due to drawbacks in terms of manufacturing or the like. For example, protruding portions 32 that protrude toward the N-type columns 22 side may be formed in the P-type columns 24 in some cases.

As one example, the N-type columns 22 and the P-type columns 24 are formed by stacking N-type layers and P-type layers, having predetermined thicknesses, from the rear surface side of the semiconductor substrate 10. However, if a position of an N-type layer or P-type layer is shifted in a predetermined layer due to shifting of a mask pattern or the like, the widths of the N-type columns 22 and the P-type columns 24 become nonuniform.

Variations in the widths of the P-type columns 24 and the N-type columns 22 result in variations in the feedback capacitances Crss. However, in order to measure the feedback capacitance Crss of a semiconductor element formed in a wafer, one has to introduce a capacitance measuring device in a manufacturing line, and sequentially connect each semiconductor element to the capacitance measuring device. For this reason, the apparatus cost and measurement time increase. Also, it is not easy to measure a minute capacitance of each semiconductor element accurately with a capacitance measuring device due to the influence of a measurement environment such as a wire.

On the other hand, the avalanche voltage BVDSS and the on-resistance RDS(on) of the semiconductor element 200 can be measured in a short period of time as compared with the feedback capacitance Crss. Also, the avalanche voltage BVDSS and the on-resistance RDS(on) are measured also in existing manufacturing steps in many cases. For this reason, these characteristics can be measured in many cases without addition of apparatuses and measurement steps.

If the distance W1 between the P-type columns 24 decreases to W2, the impurity concentration balance of the P-type columns 24 and the N-type columns 22 changes, and the withstanding voltage (avalanche voltage BVDSS) lowers. Also, because the impurity concentration in the N drift region lowers, the drift resistance increases and the on-resistance RDS(on) rises. In general, the avalanche voltage BVDSS and the on-resistance RDS(on) respectively have Gaussian distributions.

However, it is not necessarily easy to assess a distribution of the feedback capacitance Crss only from a measurement result of either the avalanche voltage BVDSS or the on-resistance RDS(on). Although in FIG. 1, two groups having relatively large differences in the feedback capacitances Crss are plotted in order to make the explanation simple, in actual cases, there may be cases where the differences in the feedback capacitances Crss are not so large. In this case, the overlap of distributions of two groups having different feedback capacitances Crss becomes large if only a measurement result of either the avalanche voltages BVDSS or the on-resistances RDS(on) is used, and variations in the feedback capacitances Crss cannot be assessed accurately.

In contrast, a distribution of the feedback capacitances Crss can be assessed accurately by using a measurement result of both the two characteristics that are correlated with the feedback capacitance Crss (for example, the avalanche voltage BVDSS and the on-resistance RDS(on), or a plurality of avalanche voltages BVDSS that are measured in a semiconductor element in different states). As one example, a ratio RDS(on)/BVDSS between an on-resistance and a withstanding voltage can provide a distribution with a small standard deviation because it has a high correlation with the feedback capacitance Crss. As a result, because respective distributions of two groups having different feedback capacitances Crss become steeper, the respective distributions can be discerned easily. According to the manufacturing method in the present example, the feedback capacitance Crss can be assessed accurately, in a short time, and at low cost.

The first characteristic and the second characteristic used to assess the feedback capacitance Crss are not limited to the avalanche voltage BVDSS and the on-resistance RDS(on). Any characteristic that is correlated with the feedback capacitance Crss can be used as the first characteristic and the second characteristic as appropriate. For example, a characteristic such as an ON voltage of a semiconductor element may be used as either the first characteristic or the second characteristic.

Also, the feedback capacitance Crss may be assessed by a method not using a ratio between the first characteristic and the second characteristic. As one example, there may be cases where a product of the first characteristic and the second characteristic is used to assess the feedback capacitance Crss.

Also, a target feedback capacitance Crss of which is assessed is not limited to an SJ-MOSFET. The feedback capacitance Crss of any element that has two characteristics whose polarities of correlation with the feedback capacitance are different from each other can be assessed by the above-mentioned method. Also, the feedback capacitance Crss can be assessed accurately similarly by using a difference in two characteristics whose polarities of correlation with the feedback capacitance Crss are different from each other. Also, the feedback capacitance Crss can be assessed accurately similarly by using a product or a sum of two characteristics whose polarities of correlation with the feedback capacitance Crss are the same.

Figure 4:
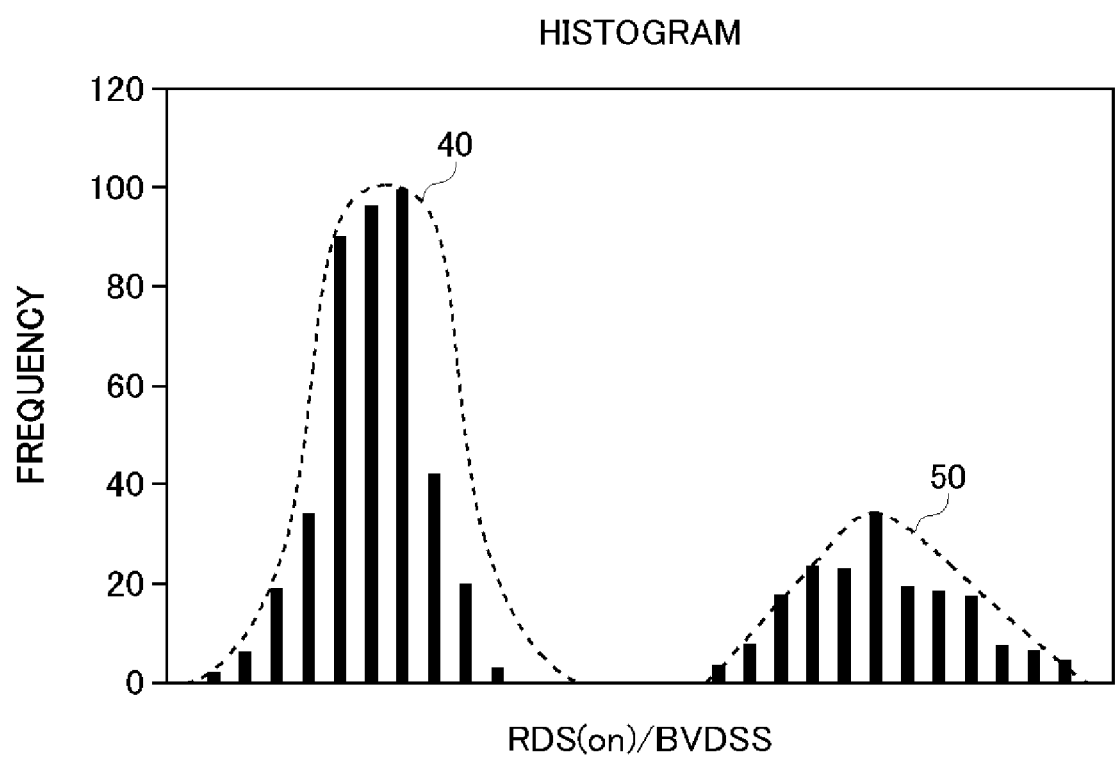
FIG. 4 is a figure for explaining a screening step of screening semiconductor elements based on a histogram.

FIG. 4 is a figure for explaining a screening step of screening semiconductor elements based on a histogram. The histogram in the present example has a first ridge 40 and a second ridge 50. In the screening step in the present example, a normal distribution included in the histogram is detected based on the histogram. Then, an abnormal semiconductor element is screened based on the detected normal distribution.

As one example, among a plurality of ridges, a ridge having the lowest RDS(on)/BVDSS may be detected as a normal distribution. The ridge corresponds to a group whose feedback capacitances Crss are the largest. Also, among a plurality of ridges, a ridge including a peak having a higher frequency may be detected as a normal distribution. In the example shown in FIG. 4, the first ridge 40 is detected as a normal distribution.

Also, a semiconductor element not included in the first ridge 40 may be screened as an abnormal product. Whether or not a semiconductor element is included in the first ridge 40 may be judged based on a standard deviation σ of the first ridge 40. For example, a semiconductor element not included within 1σ from an average value of the first ridge 40 may be screened as an abnormal product, a semiconductor element not included within 3σ may be screened as an abnormal product, or a semiconductor element not included within 6σ may be screened as an abnormal product.

Also, in a case where a histogram includes a plurality of ridges, a semiconductor element not included in any of the ridges may be screened as an abnormal product. In this case, a plurality of semiconductor elements are grouped based on ridges to which they correspond. Thereby, the number of semiconductor elements excluded as abnormal products are reduced, and variations in the feedback capacitances Crss within a group can be suppressed.

Figure 5:
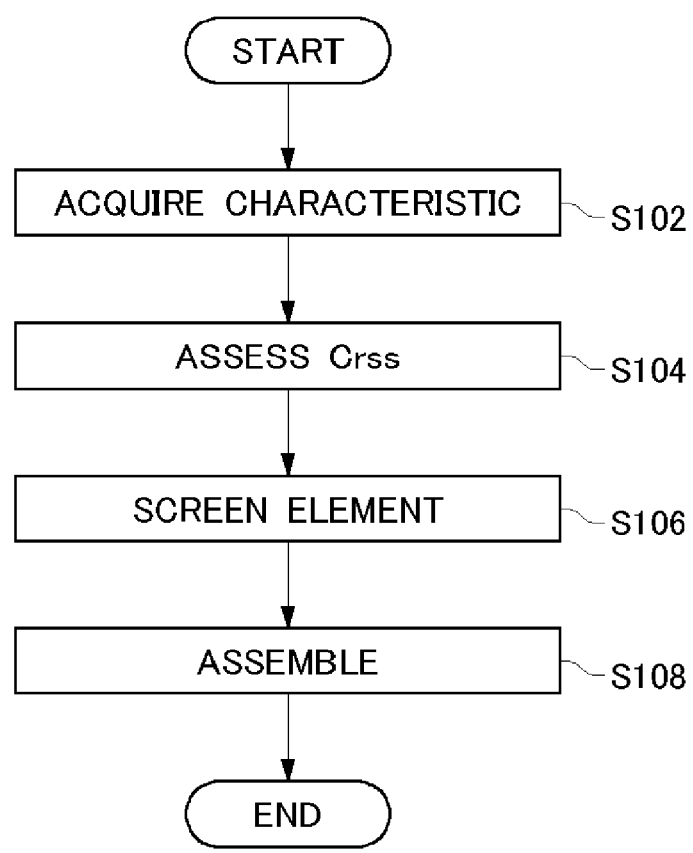
FIG. 5 is a figure showing an exemplary flow of a manufacturing method of manufacturing a semiconductor device.

FIG. 5 is a figure showing an exemplary flow of a manufacturing method of manufacturing a semiconductor device. First, at a characteristic acquiring step S102, the first characteristic and the second characteristic are acquired for each semiconductor element among a plurality of semiconductor elements. The characteristic acquiring step S102 is similar to the characteristic acquiring step S102 explained with reference to FIG. 1 to FIG. 4.

Next, at an assessment step S104, the feedback capacitance Crss is assessed based on the first characteristic and the second characteristic. The assessment step S104 is similar to the assessment step S104 explained with reference to FIG. 1 to FIG. 4.

Next, at a screening step S106, a plurality of semiconductor elements are screened based on an assessment result obtained at the assessment step S104. The screening step S106 is the same as the screening step explained with reference to FIG. 4. At the screening step S106, a plurality of semiconductor elements having variations in the feedback capacitances Crss which are equal to a predetermined value or lower are screened. For example, in the histogram shown in FIG. 4, any of the ridges is selected. Also, assuming the standard deviation of the selected ridge as being σ, a plurality of semiconductor elements having variations within σ/2 may be further screened, or a plurality of semiconductor elements whose variations are within σ/4 may be further screened. Although at the screening step S106, as one example, a plurality of semiconductor elements having variations in the feedback capacitances Crss which are equal to a predetermined value or lower are screened, this is merely an example, and a plurality of semiconductor elements are screened by selecting a proper range for variations in the feedback capacitances Crss.

Next, at an assembly step S108, a semiconductor device is assembled by using a plurality of semiconductor elements that are screened at the screening step S106. A semiconductor device may be an electric circuit including a plurality of semiconductor elements. By such a manufacturing method, a semiconductor device using a plurality of semiconductor elements having smaller variations in the feedback capacitances Crss can be manufactured.

Figure 6:
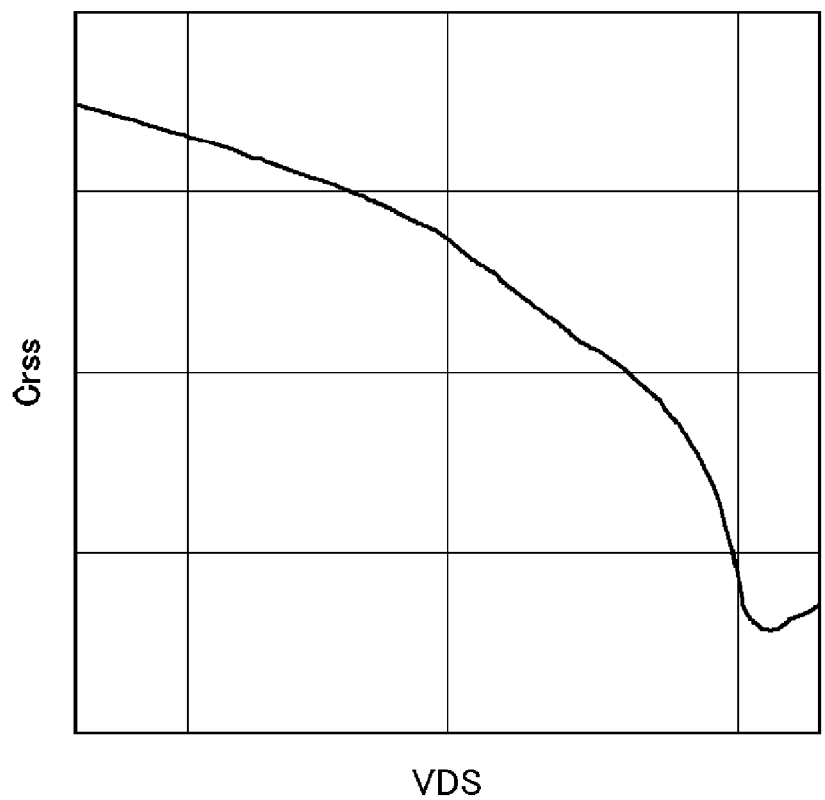
FIG. 6 is a figure showing exemplary voltage-dependence of a feedback capacitance Crss in an SJ-MOSFET.

FIG. 6 is a figure showing exemplary voltage-dependence of a feedback capacitance Crss in an SJ-MOSFET. There are cases where in an SJ-MOSFET, depletion of a substrate is suppressed by providing a concentration gradient in each column so as to improve a trade-off relationship between a turn-off loss and a turn-off dv/dt. In this case, dependence of the feedback capacitance Crss on a drain-source voltage VDS becomes less steep as shown in FIG. 6.

However, if a concentration gradient is provided in each column, the feedback capacitance Crss increases, and the switching loss increases. For this reason, with recent increased necessity for power saving, the concentration gradient of each column is reduced in some cases. As a result, the VDS dependence of the feedback capacitance Crss is enhanced, and variations in VDS result in acute variations in the feedback capacitances Crss.

Figure 7:
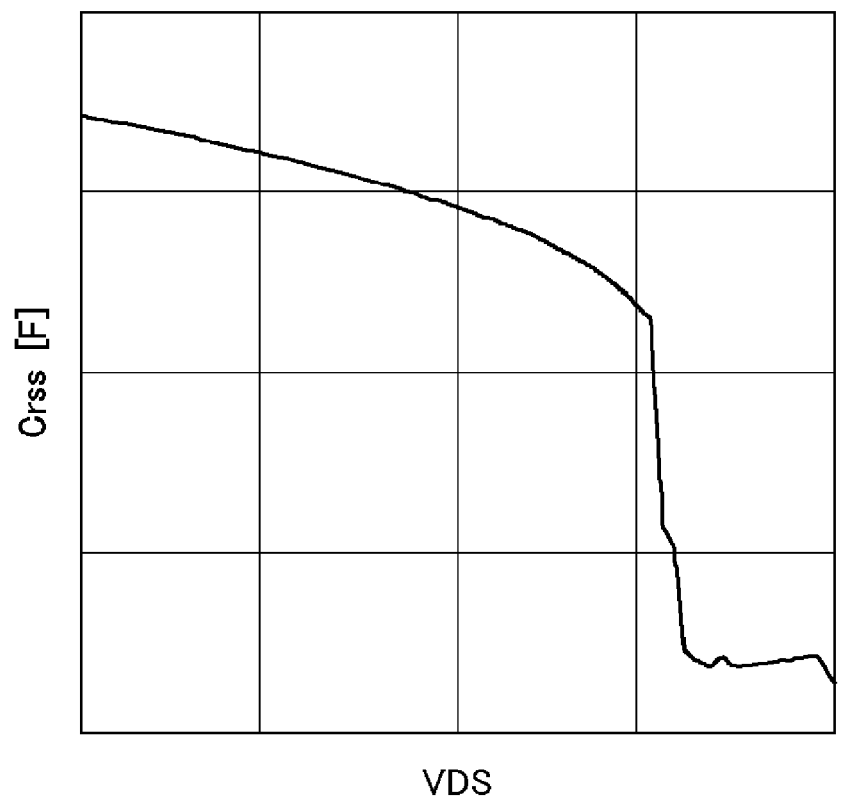
FIG. 7 is a figure showing voltage-dependence of a feedback capacitance Crss in an SJ-MOSFET in which switching loss has been decreased by decreasing a concentration gradient of each column.

FIG. 7 is a figure showing voltage-dependence of a feedback capacitance Crss in an SJ-MOSFET in which switching loss has been decreased by decreasing the concentration gradient of each column. As mentioned above, if the concentration gradient of each column is deceased, the waveform of the feedback capacitance Crss becomes steep. For this reason, variations in the feedback capacitances Crss increase among a plurality of semiconductor elements.

If a plurality of semiconductor elements having large variations in the feedback capacitances Crss are incorporated into a single semiconductor device, the variations in the feedback capacitances Crss may result in differences in switching timing or the like, and malfunction of the semiconductor device may also occur. In contrast, a semiconductor device manufactured by the manufacturing method shown in FIG. 5 can be manufactured by using a plurality of semiconductor elements having smaller variations in the feedback capacitances Crss, malfunctioning of the semiconductor device can be reduced.

The examples shown in FIG. 8 to FIG. 15 are explained with reference to a case where the feedback capacitances Crss of defective products are low relative to the feedback capacitances Crss of normal products. In this case, in the histogram shown in FIG. 4, a ridge having the highest RDS(on)/BVDSS may be detected as a normal distribution.

Figure 8:
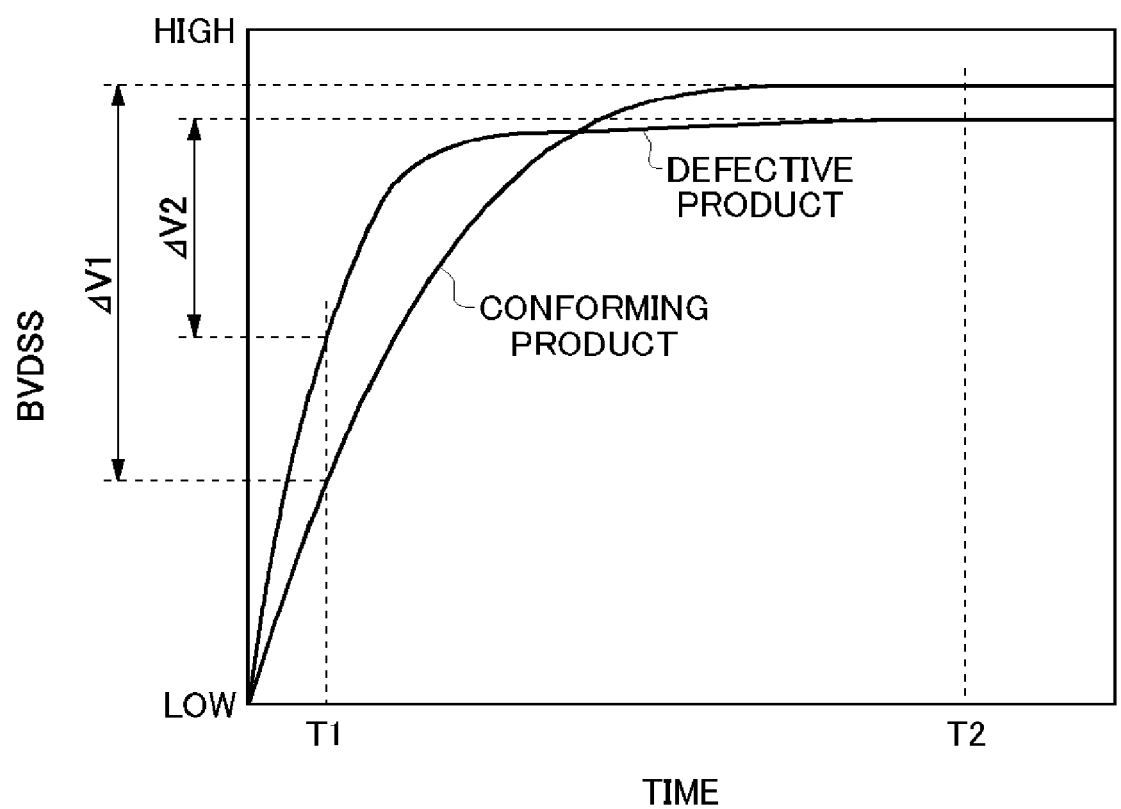
FIG. 8 is a figure showing an exemplary measurement result of avalanche voltages BVDSS in semiconductor elements which are a conforming product and a defective product.

FIG. 8 is a figure showing an exemplary measurement result of avalanche voltages BVDSS in semiconductor elements which are a conforming product and a defective product. In FIG. 8, the horizontal axis indicates an elapsed period of time since a predetermined drain current is started to be applied to a semiconductor element whose gate and source are short-circuited, and the vertical axis indicates an avalanche voltage BVDSS (drain-source voltage).

If a drain current is applied to a semiconductor element whose gate and source are short-circuited, the output capacitance Coss is charged by the drain current, and the avalanche voltage BVDSS increases gradually. The output capacitance Coss is a sum of the capacitance between the drain and the source and the capacitance between the gate and the drain. Because the feedback capacitance Crss is the gate-drain capacitance, the lower the feedback capacitance Crss is, the lower the output capacitance Coss is. For this reason, the lower the feedback capacitance Crss is, the steeper the rising of the avalanche voltage BVDSS becomes.

Due to differences in rising rates of the avalanche voltages BVDSS, a difference is generated in the avalanche voltages BVDSS in their transitional states between a conforming product and a defective product. For example, assuming that a difference between an avalanche voltage BVDSS after an elapsed period of time T1 and an avalanche voltage BVDSS after an elapsed period of time T2 shown in FIG. 8 is ΔV, a differential voltage ΔV1 of a conforming product is higher than a differential voltage ΔV2 of a defective product. In FIG. 8, it is assumed that a predetermined elapsed period of time in a transitional state is T1, and a predetermined elapsed period of time in a steady state is T2. For example, T1 is approximately 2 ms, and T2 is approximately 20 ms. The transitional state refers to a state where the output capacitance Coss is being charged with a drain current, and the avalanche voltage BVDSS is increasing, and the steady state refers to a state where the charging of the output capacitance Coss has ended, and the avalanche voltage BVDSS has become almost constant.

In the assessment method of assessing the feedback capacitance Crss, variations in the avalanche voltages BVDSS in a transitional state may be utilized. The first characteristic may be the avalanche voltage BVDSS in a transitional state. Also, the first characteristic may be calculated from a plurality of the avalanche voltages BVDSS measured in a semiconductor element that is brought into different states. States of a semiconductor element may refer to the above-mentioned transitional state and steady state. That is, the first characteristic may be calculated from the avalanche voltage BVDSS in a transitional state and the avalanche voltage BVDSS in a steady state. The first characteristic may be calculated either one of a ratio, product, difference and sum of these two avalanche voltages BVDSS. Thereby, a difference in the feedback capacitances Crss between a conforming product and a defective product can be made more noticeable.

Also, the state of a semiconductor element can be changed by a drain current id applied to a semiconductor element. That is, the first characteristic may be calculated from a plurality of avalanche voltages measured by applying different drain currents. In this case, respective avalanche voltages are measured in a transitional state. By measuring the avalanche voltages BVDSS in a transitional state while making different the drain currents to charge the output capacitance Coss, a difference in the feedback capacitances Crss between a conforming product and a defective product can be made more noticeable.

Also, although the examples shown in FIG. 1 to FIG. 7 are explained as examples in which the feedback capacitance Crss is assessed by using the on-resistance RDS(on), in other examples, the feedback capacitance Crss may be assessed without using the on-resistance RDS(on). For example, the first characteristic may be calculated from the avalanche voltage BVDSS of a semiconductor element, and the second characteristic may be calculated from the avalanche voltage BVDSS measured in the semiconductor element in a state which is different from that of the first characteristic.

Figure 9:
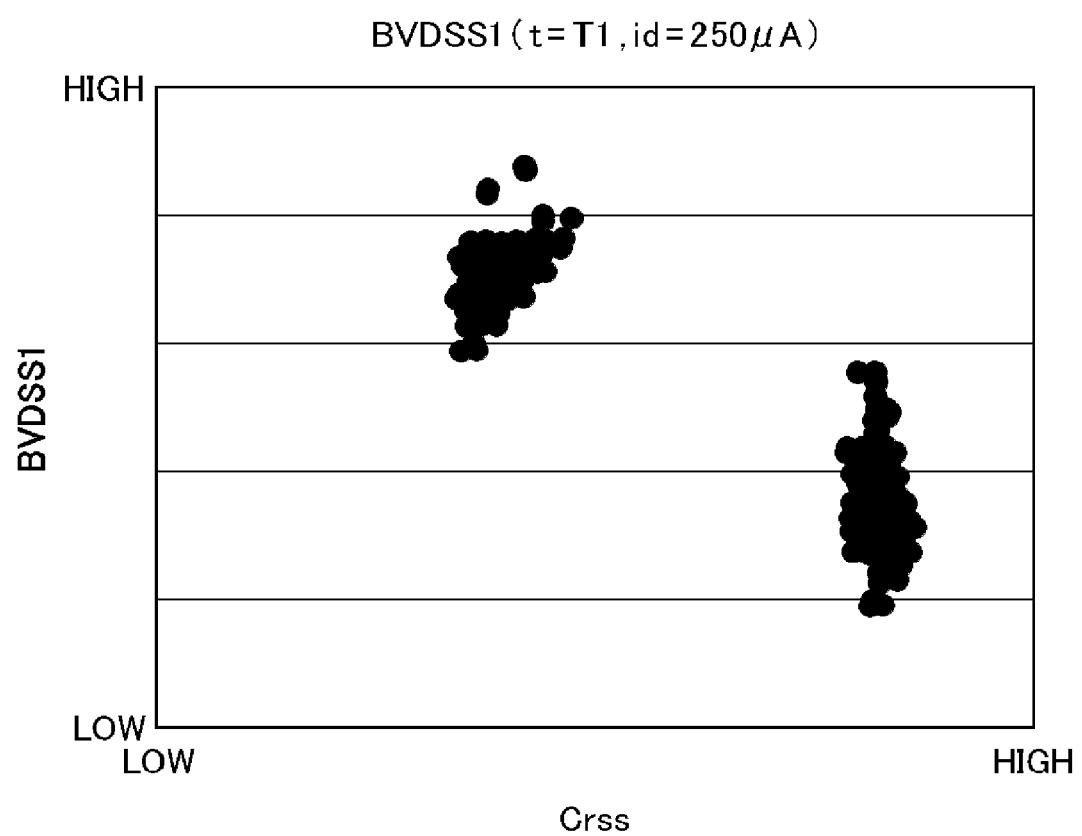
FIG. 9 is a figure showing an exemplary first characteristic.

FIG. 9 is a figure showing an exemplary first characteristic. The first characteristic in the present example is a first avalanche voltage BVDSS1 in a transitional state. The first avalanche voltage BVDSS1 in the present example is measured under a condition of a drain current id=250 µA and an elapsed period of time T1. In FIG. 9, a group having lower feedback capacitances Crss corresponds to defective products, and a group having higher feedback capacitances Crss corresponds to conforming products. The feedback capacitances Crss may be assessed based on the first avalanche voltage BVDSS1 shown in FIG. 9 and RDS(on) shown in FIG. 1.

Figure 10:
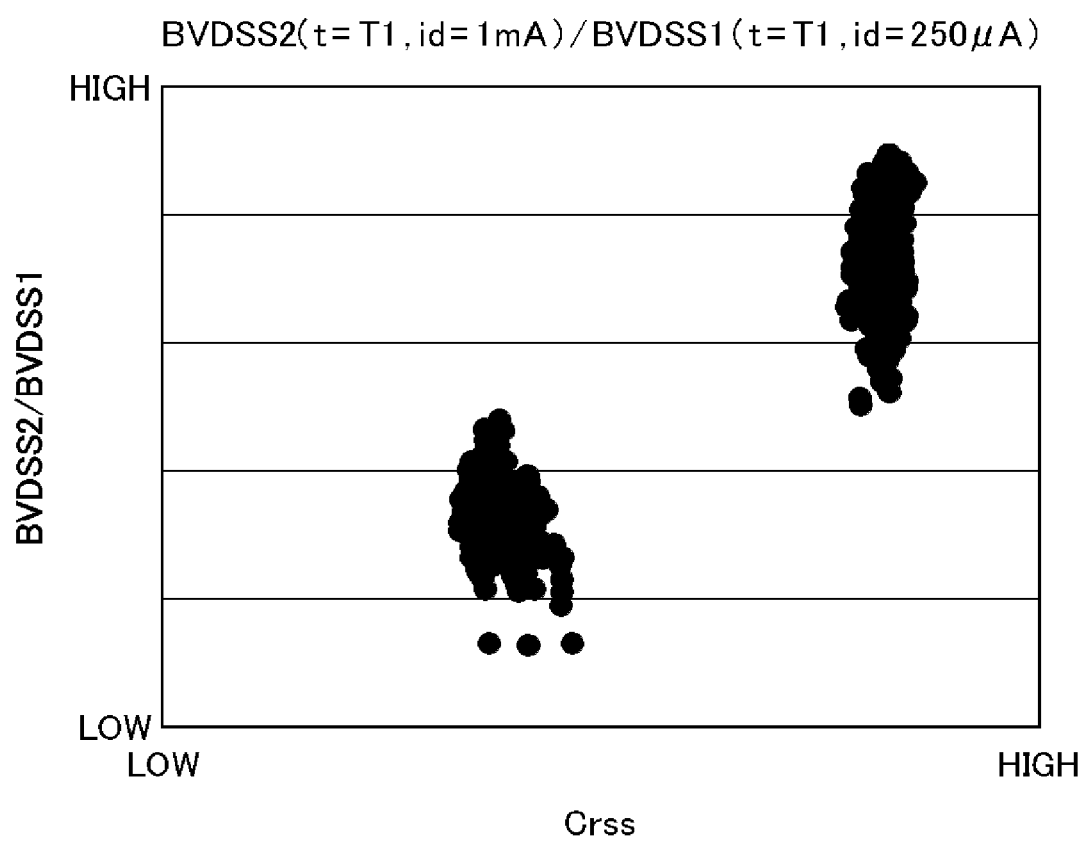
FIG. 10 is a figure showing an exemplary first characteristic.

FIG. 10 is a figure showing an exemplary first characteristic. The first characteristic in the present example is calculated from two avalanche voltages BVDSS measured after a single elapsed period of time T in a transitional state by applying different drain currents. More specifically, the first characteristic is a ratio BVDSS2/BVDSS1 between a first avalanche voltage BVDSS1 measured under a condition of a drain current id=250 µA and an elapsed period of time T1, and a second avalanche voltage BVDSS2 measured under a condition of a drain current id=1 mA and an elapsed period of time T1. The feedback capacitance Crss may be assessed based on BVDSS2/BVDSS1 shown in FIG. 10 and RDS(on) shown in FIG. 1.

Also, the feedback capacitance Crss may be assessed by using the first avalanche voltage BVDSS1 as the first characteristic and the second avalanche voltage BVDSS2 as the second characteristic. As one example, the feedback capacitance Crss may be assessed from BVDSS2/BVDSS1 without using a measurement result of RDS(on).

Figure 11:
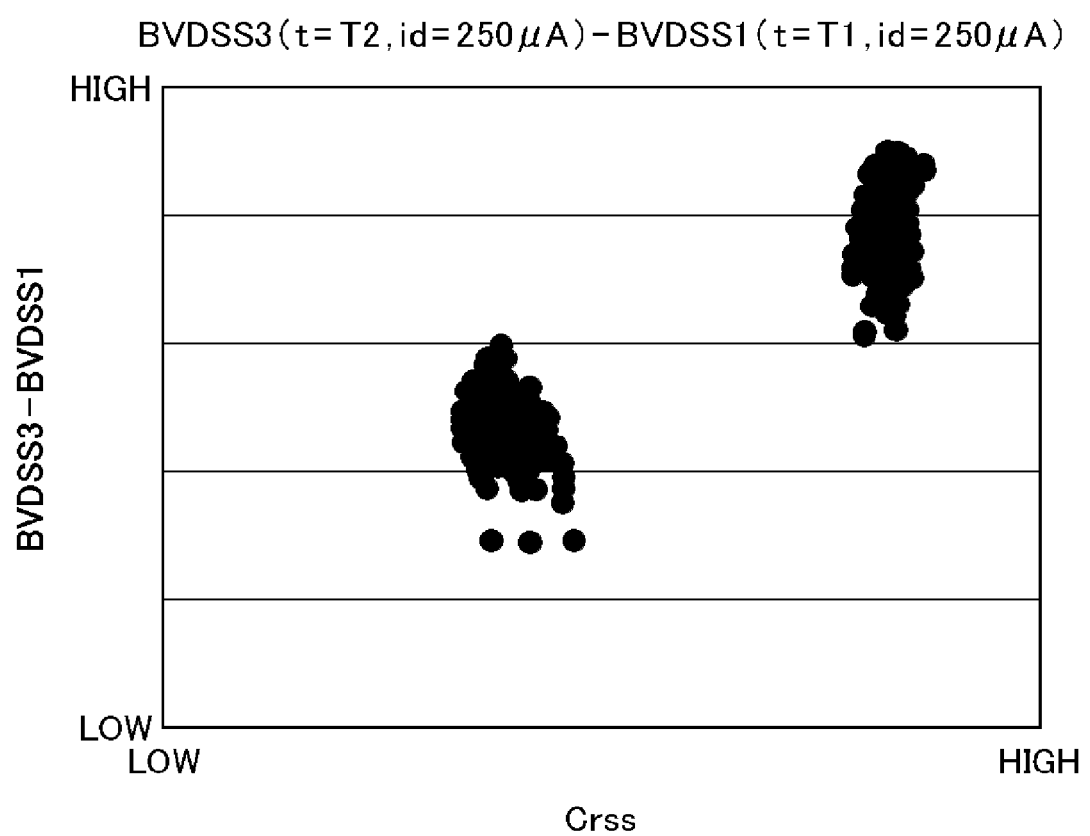
FIG. 11 is a figure showing an exemplary first characteristic.

FIG. 11 is a figure showing an exemplary first characteristic. The first characteristic in the present example is calculated from two avalanche voltages BVDSS measured after different elapsed periods of time without changing a drain current. One avalanche voltage BVDSS is measured in a transitional state, and the other avalanche voltage BVDSS is measured in a steady state.

More specifically, the first characteristic is a difference BVDSS3−BVDSS1 between the first avalanche voltage BVDSS1 measured under a condition of a drain current id=250 µA and an elapsed period of time T1, and the third avalanche voltage BVDSS3 measured under a condition of a drain current id=250 µA and an elapsed period of time T2. The feedback capacitance Crss may be assessed based on BVDSS3−BVDSS1 shown in FIG. 11 and RDS(on) shown in FIG. 1.

Also, the feedback capacitance Crss may be assessed by using the first avalanche voltage BVDSS1 as the first characteristic and the third avalanche voltage BVDSS3 as the second characteristic. As one example, the feedback capacitance Crss may be assessed from BVDSS3−BVDSS1 without using a measurement result of RDS(on).

Figure 12:
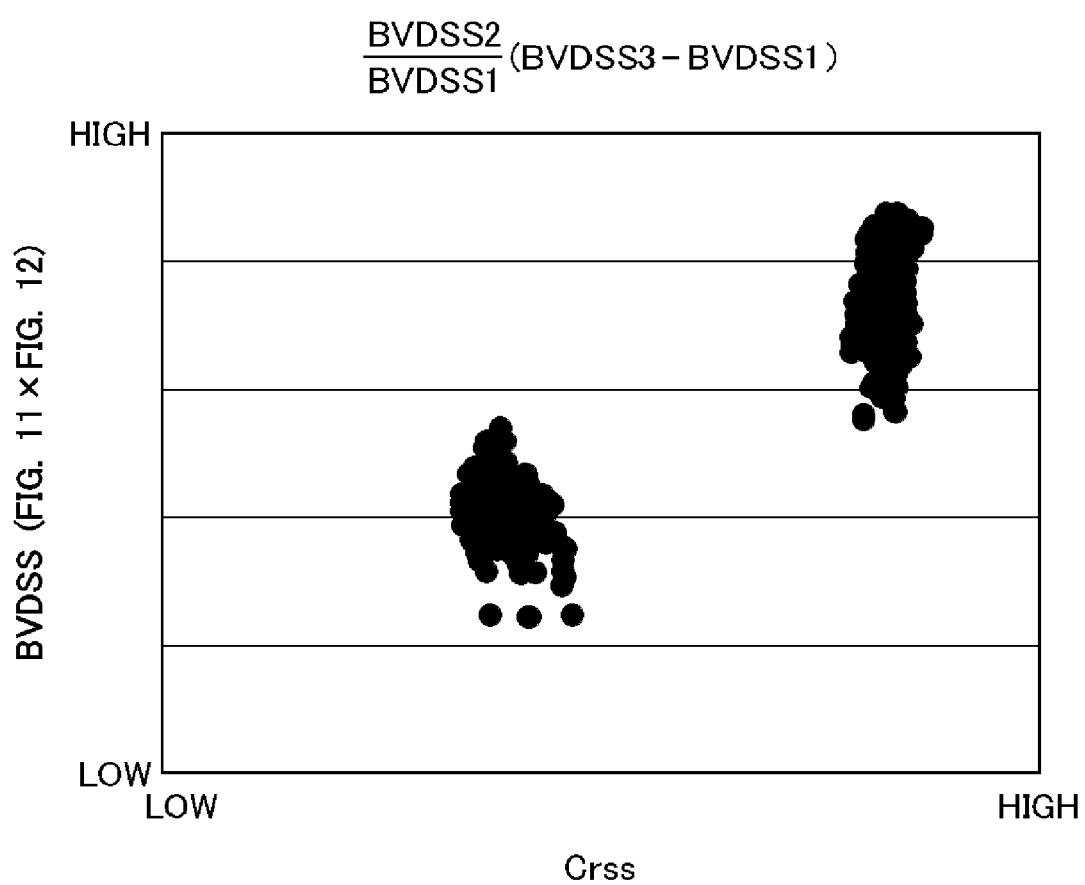
FIG. 12 is a figure showing an exemplary first characteristic.

FIG. 12 is a figure showing an exemplary first characteristic. The first characteristic in the present example is calculated from:
a first avalanche voltage BVDSS1 in a transitional state;
a second avalanche voltage BVDSS2 in a transitional state measured by applying a drain current that is different from that for the first avalanche voltage BVDSS1; and
a third avalanche voltage BVDSS3 in a steady state measured by applying a drain current which is the same as that for either the first avalanche voltage BVDSS1 or the second avalanche voltage BVDSS2.

More specifically, the first characteristic is a product of the first characteristic BVDSS2/BVDSS1 shown in FIG. 10 and the first characteristic BVDSS3−BVDSS1 shown in FIG. 11. The feedback capacitance Crss may be assessed based on BVDSS2×(BVDSS3−BVDSS1)/BVDSS1 shown in FIG. 12 and RDS(on) shown in FIG. 1.

Also, the feedback capacitance Crss may be assessed by using BVDSS2/BVDSS1 shown in FIG. 10 as the first characteristic, and BVDSS3−BVDSS1 shown in FIG. 11 as the second characteristic. As one example, the feedback capacitance Crss may be assessed from BVDSS2×(BVDSS3−BVDSS1)/BVDSS1 without using a measurement result of RDS(on).

Figure 13:
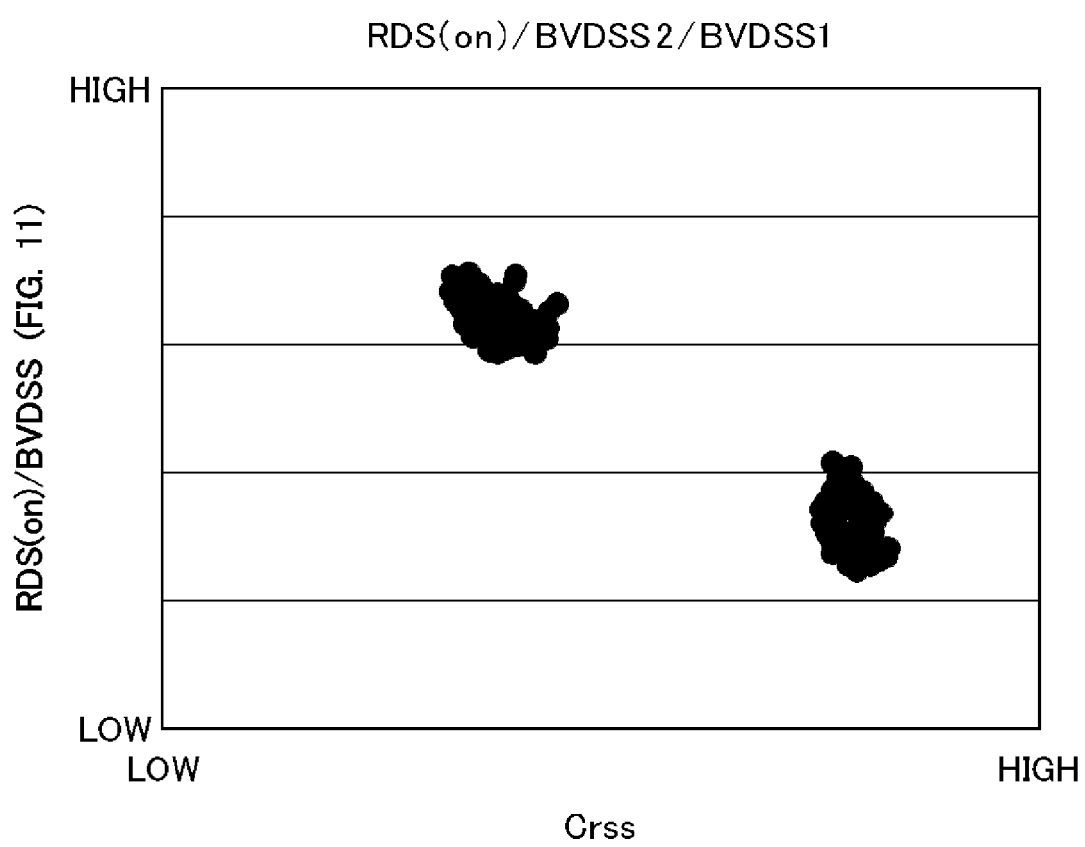
FIG. 13 is a figure showing a relationship of feedback capacitances Crss with ratios between the first characteristic BVDSS2/BVDSS1 shown in FIG. 10 and the second characteristic RDS(on) shown in FIG. 1.

FIG. 13 is a figure showing a relationship of feedback capacitances Crss with ratios between the first characteristic BVDSS2/BVDSS1 shown in FIG. 10 and the second characteristic RDS(on) shown in FIG. 1. It can be seen that by calculating a ratio between BVDSS2/BVDSS1 and RDS(on), a group of normal products and a group of error products are separated along the vertical axis. For this reason, normal products and error products can be discerned accurately.

Figure 14:
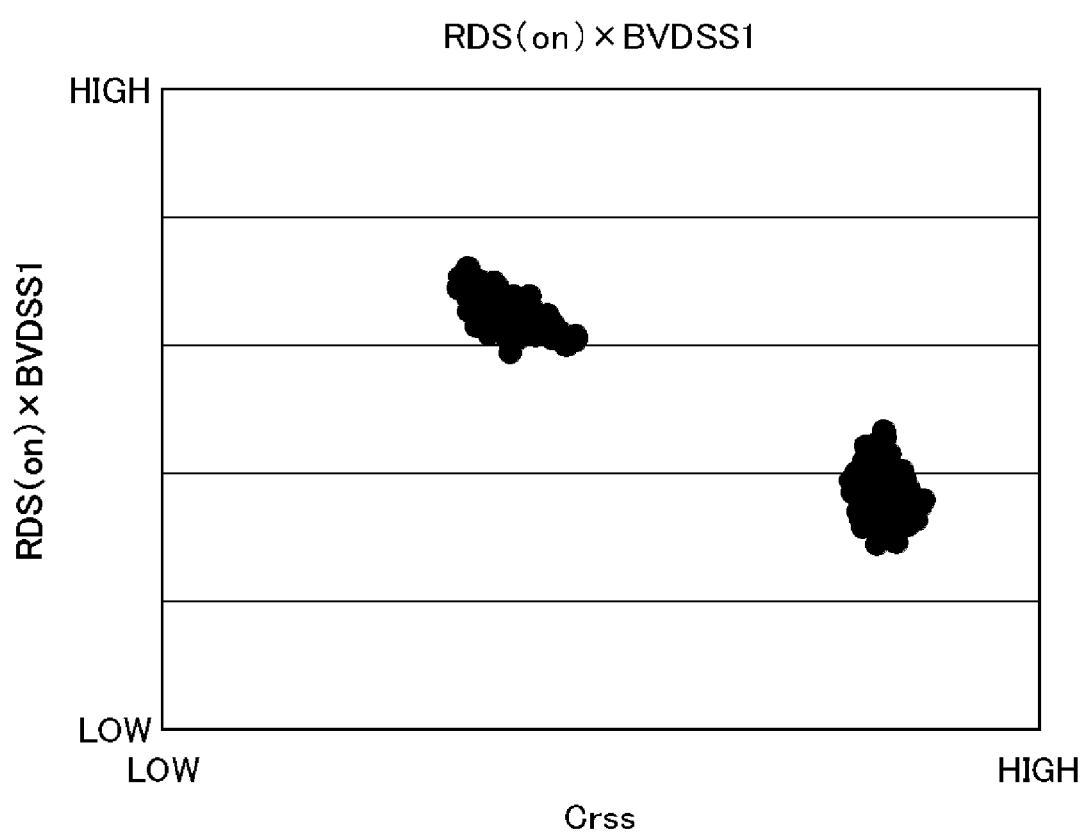
FIG. 14 is a figure showing a relationship of feedback capacitances Crss with ratios between the first characteristic BVDSS1 shown in FIG. 9 and the second characteristic RDS(on) shown in FIG. 1.

FIG. 14 is a figure showing a relationship of feedback capacitances Crss with ratios between the first characteristic BVDSS1 shown in FIG. 9 and the second characteristic RDS(on) shown in FIG. 1. In the present example also, normal products and error products can be discerned accurately.

Figure 15:
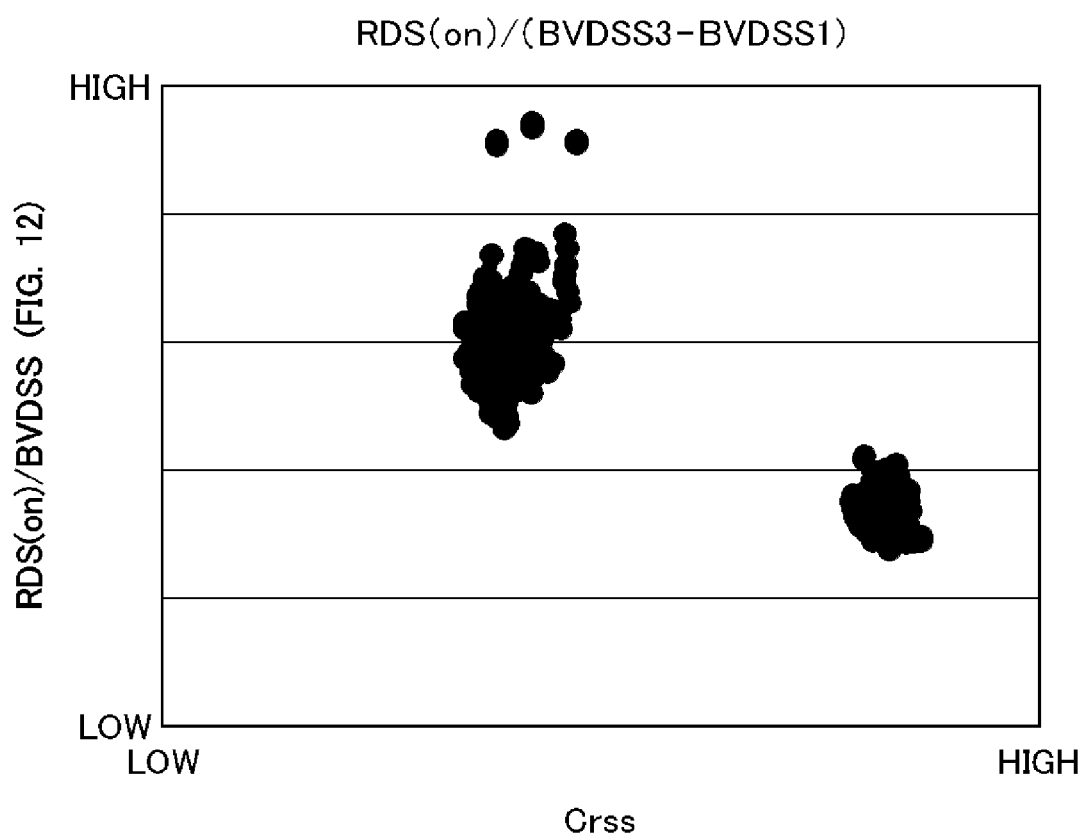
FIG. 15 is a figure showing a relationship of feedback capacitances Crss with ratios between the first characteristic BVDSS3−BVDSS1 shown in FIG. 11 and the second characteristic RDS(on) shown in FIG. 1.

FIG. 15 is a figure showing a relationship of feedback capacitances Crss with ratios between the first characteristic BVDSS3−BVDSS1 shown in FIG. 11 and the second characteristic RDS(on) shown in FIG. 1. In the present example also, normal products and error products can be discerned accurately.

In the examples shown in FIG. 9 to FIG. 15, a difference between respective characteristics may be used instead of a ratio between respective characteristics, a sum of respective characteristics may be used instead of a product of respective characteristics, or a ratio between respective characteristics may be used instead of a difference between respective characteristics.

Figure 16:
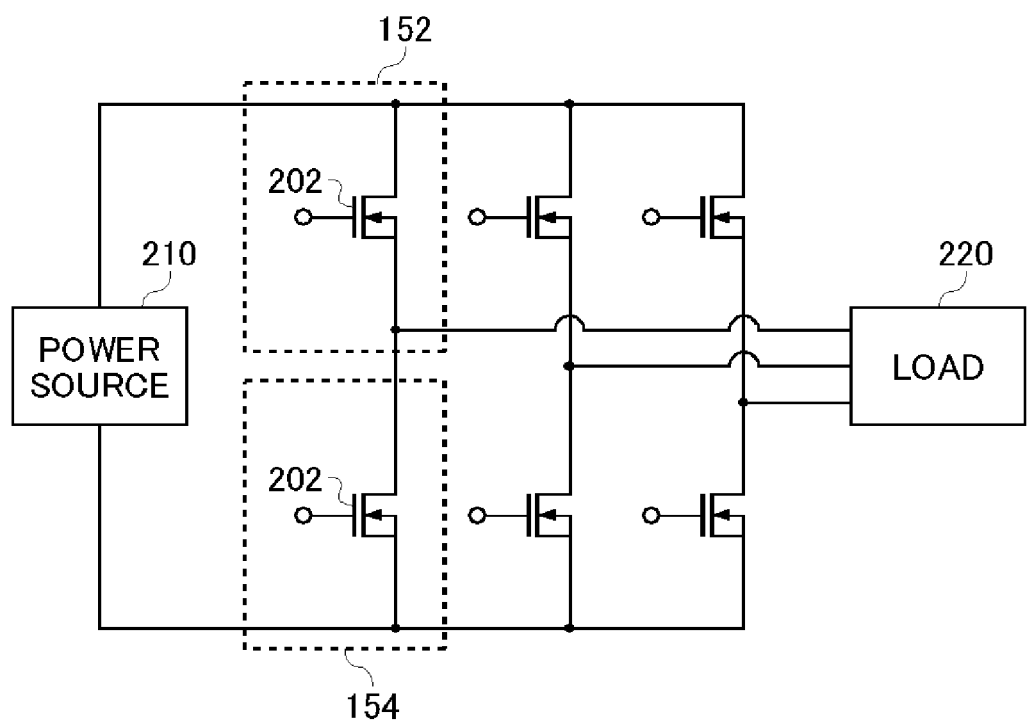
FIG. 16 is a figure showing an exemplary semiconductor device 300.

FIG. 16 is a figure showing an exemplary semiconductor device 300. The semiconductor device 300 is a three-phase inverter circuit provided between a power source 210 and a load 220. The load 220 is for example a three-phase motor. The semiconductor device 300 converts electric power supplied from the power source 210 into three-phase signals (AC voltage), and supplies them to the load 220.

The semiconductor device 300 has three bridges corresponding to the three-phase signals. The bridges each have an upper arm 152 and a lower arm 154 provided in series between a positive-side wire and a negative-side wire. The respective arms are provided with one or more MOSFETs 202. Instead of the MOSFETs 202, the respective arms may be provided with a combination of a transistor and a diode such as an FWD. A signal of each phase is output from a connection point between the upper arm 152 and the lower arm 154.

If variations in the feedback capacitances Crss at the MOSFETs 202 in each arm are large, the MOSFETs 202 of the upper arm 152 and the lower arm 154 are simultaneously turned on, and the upper arm 152 and the lower arm 154 are short-circuited in some cases. In contrast, a plurality of the MOSFETs 202 in the semiconductor device 300 in the present example are screened by the method explained with reference to FIG. 1 to FIG. 5. Accordingly, variations in the feedback capacitances Crss in the plurality of MOSFETs 202 can be decreased, and malfunctioning such as current imbalance when used in parallel, and arm short circuiting can be suppressed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: semiconductor substrate; 12: gate electrode; 14: gate insulating film; 16: source region; 18: contact region; 20: base region; 22: N-type column; 24: P-type column; 26: drain region; 28: source electrode; 30: drain electrode; 32: protruding portion; 40: ridge; 50: ridge; 200: semiconductor element; 152: upper arm; 154: lower arm; 202: MOSFET; 210: power source; 220: load; 300: semiconductor device

What is claimed is:

1. An assessment method of assessing a feedback capacitance of a semiconductor element, the assessment method comprising:
   directly measuring a first avalanche voltage of the semiconductor element while in a first state, the first avalanche voltage being correlated with the feedback capacitance;
   directly measuring a second avalanche voltage of the semiconductor element while in a second state different from the first state, the second avalanche voltage being correlated with the feedback capacitance; and
   assessing the feedback capacitance without a measurement of the feedback capacitance based on a ratio relationship between the first avalanche voltage and the second avalanche voltage.

2. The assessment method according to claim 1, wherein the second state is a steady state.

3. The assessment method according to claim 1, wherein the second state is transitional state.

4. The assessment method according to claim 1, wherein the first state is a steady state and the second state is a transitional state.

5. The assessment method according to claim 1, wherein the first state is a first transitional state with a first drain current, and the second state is a second transitional state with a second drain current different from the first drain current.

6. The assessment method according to claim 5, further comprising:
   acquiring a third avalanche voltage of the semiconductor element while in a third state different from the first state and from the second state, the third avalanche voltage being correlated with the feedback capacitance,
   wherein the first state is a first transitional state with a first drain current, the second state is a second transitional state with a second drain current different from the first drain current, and the third state is a third transitional state with a third drain current which is the same as one of the first drain current and the second drain current.

7. The assessment method according to claim 1, wherein the assessment method is performed on a plurality of the semiconductor elements, and
   the assessing the feedback capacitance includes generating distribution information indicative of a distribution of the ratio first avalanche voltage/second avalanche voltage relationship between the first avalanche voltage and the second avalanche voltage of each semiconductor element among the plurality of semiconductor elements.

8. The assessment method according to claim 7, further comprising
   detecting a normal distribution included in the distribution information, and
   screening an abnormal semiconductor element among the plurality of semiconductor elements based on the detected normal distribution therefore.

9. The assessment method according to claim 8, wherein the screening includes screening the abnormal semiconductor element based on a standard deviation of the normal distribution.

10. The assessment method according to claim 9, wherein the distribution information is a histogram, and
    the screening includes detecting, as the normal distribution, a ridge including a peak of a higher frequency if the histogram includes a plurality of ridges.

11. The assessment method according to claim 1, wherein the assessment method is performed on each semiconductor element among a plurality of the semiconductor elements that are formed on a wafer.

12. The assessment method according to claim 1, wherein the semiconductor element has a super junction structure.

13. The assessment method according to claim 1, wherein the first avalanche voltage is inversely correlated with the feedback capacitance.

14. The assessment method according to claim 1, wherein the semiconductor element is in a wafer state.

15. A semiconductor device manufacturing method, comprising:
    for each semiconductor element among a plurality of semiconductor elements, acquiring a first avalanche voltage of the semiconductor element while in a first state, the first avalanche voltage being correlated with a feedback capacitance of the semiconductor element, and acquiring a second avalanche voltage of the semiconductor element while in a second state different from the first state, the second avalanche voltage being correlated with the feedback capacitance;
    assessing the feedback capacitance without measuring the feedback capacitance based on a ratio first avalanche voltage/second avalanche voltage relationship between the first avalanche voltage and the second avalanche voltage;
    screening the plurality of semiconductor elements based on an assessment result obtained in the assessing; and
    assembling the semiconductor device by using the plurality of semiconductor elements screened in the screening.

* * * * *